United States Patent
Uralsky

(10) Patent No.: US 11,418,212 B2
(45) Date of Patent: Aug. 16, 2022

(54) PARALLEL DECODING TECHNIQUES

(71) Applicant: NVIDIA CORPORATION, Santa Clara, CA (US)

(72) Inventor: Yury Y. Uralsky, Santa Clara, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 17/325,941

(22) Filed: May 20, 2021

(65) Prior Publication Data
US 2022/0109453 A1 Apr. 7, 2022

Related U.S. Application Data

(60) Provisional application No. 63/088,429, filed on Oct. 6, 2020.

(51) Int. Cl.
*H03M 7/40* (2006.01)
*H03M 7/30* (2006.01)

(52) U.S. Cl.
CPC .......... *H03M 7/6005* (2013.01); *H03M 7/40* (2013.01)

(58) Field of Classification Search
CPC ............................. H03M 7/6005; H03M 7/40
USPC .......................................................... 341/67
See application file for complete search history.

(56) References Cited

U.S. PATENT DOCUMENTS

| | | | |
|---|---|---|---|
| 2009/0073007 A1* | 3/2009 | Jia | H04N 19/91 341/67 |
| 2009/0261995 A1* | 10/2009 | Sakaguchi | H03M 7/40 341/67 |

* cited by examiner

*Primary Examiner* — Jean B Jeanglaude
(74) *Attorney, Agent, or Firm* — Artegis Law Group, LLP

(57) ABSTRACT

In various embodiments, an encoded sequence (e.g., a compressed sequence for uncompressed data) that includes variable-length codes is decoded in an iterative fashion to generate a decoded sequence of symbols. During each iteration, a group of threads decode in parallel the codes in the encoded sequence to generate symbols. The group of threads then compute offsets based on the sizes of the symbols. Subsequently, the group of threads generates in parallel a contiguous portion of the decoded sequence based on the symbols, an output address, and the offsets.

20 Claims, 6 Drawing Sheets

PARALLEL DECODING TECHNIQUES

CROSS-REFERENCE TO RELATED APPLICATIONS

This application claims priority benefit of the United States Provisional Patent Application titled, "Data-Parallel Decoding of Entropy-Coded Messages," filed on Oct. 6, 2020 and having Ser. No. 63/088,429. The subject matter of this related application is hereby incorporated herein by reference.

BACKGROUND

Field of the Various Embodiments

The various embodiments relate generally to parallel processing systems and, more specifically, to parallel decoding techniques.

DESCRIPTION OF THE RELATED ART

Lossless data encoding algorithms and the corresponding data decoding algorithms are used to reduce the resources required to store and transmit data without incurring any information loss. Oftentimes, a lossless data encoding algorithm executing on a computing device maps a source sequence of literals (e.g., bytes or alphabetic characters) represented as fixed-length "symbols" to an encoded sequence of "codes" having a reduced size. Subsequently, the computing device and/or any number of other computing devices that acquire the encoded sequence execute corresponding data decoding algorithms to map the encoded sequence to a decoded sequence of symbols. The decoded sequence of symbols represents a decoded sequence of literals that is a replica of the source sequence of literals.

Lossless data encoding algorithms are often based on entropy coding techniques that are optimized for a combination of size reduction or "compression ratio" and decoding throughput. In some types of entropy encoding, the lengths of codes vary inversely to the frequency of the corresponding symbols. Accordingly, relatively short codes are used to represent commonly used symbols and relatively longer codes are used to represent infrequently used symbols. In addition to entropy coding, some algorithms can map symbols representing copies or "copy" symbols to "copy" codes. Each copy symbol is a back-reference specifying the locations and length of a string of literals in the source sequence.

One challenge associated with decoding encoded sequences as described above is that, because of the variable lengths of the codes, directly addressing and properly decoding specific codes within an encoded sequence in a non-serial fashion is problematic. As a result, data decoding algorithms are unable to efficiently parallelize the decoding of the resulting encoded sequences and therefore the decoding throughput for client devices capable of parallel processing can be unnecessarily low.

For instance, in one approach to "data-parallel" decoding, a subsequence-based encoding algorithm executing on a computing device partitions a given sequence into symbol-aligned encoded subsequences and generates metadata specifying an input pointer for each encoded subsequence. The metadata is then stored and/or transmitted to other computing device along with the encoded sequence that is made up of the encoded subsequences. On the computing device and/or the other computing devices, a subsequence-based decoding algorithm assigns the input pointers and the corresponding encoded subsequences to different threads. For each thread, the subsequence-based decoding algorithm also computes an output pointer that delineates where the thread is to store literals represented by decoded symbols within the decoded sequence. In parallel to the other threads, each thread sequentially decodes the codes in the assigned encoded subsequence as per the input pointer of the thread and stores the literals represented by the decoded symbols in the decoded sequence as per the output thread of the thread.

One drawback of performing data-parallel decoding based on subsequences is that transmitting and/or storing the metadata reduces the compression ratio. Another drawback is that the threads access memory sparsely when reading from the encoded sequence and when writing to the decoded sequence. As is well-known, accessing memory sparsely can degrade processing efficiency and therefore can decrease the decoding throughput. Yet another drawback of performing data-parallel decoding based on subsequences is that a copy code can be read by one thread before the original string of literals referenced by the copy code is stored in the decoded sequence by another thread. To address this problem, the copy codes are usually stored for deferred processing, consuming additional memory and further decreasing decoding throughput.

As the foregoing illustrates, what is needed in the art are more effective techniques for data-parallel decoding of encoded sequences that include variable-length codes.

SUMMARY

One embodiment of the present invention sets forth a method for decoding an encoded sequence that includes variable-length codes. The method includes determining a first set of codes based on the encoded sequence; decoding the first set of codes to generate a first set of symbols; determining a first set of offsets based on the first set of symbols; and generating a first contiguous portion of a decoded sequence based on the first set of symbols, the first set of offsets, and a first address.

At least one technical advantage of the disclosed techniques relative to the prior art is that, with the disclosed techniques, parallelizing decoding of encoded sequences that include variable-length codes does not reduce compression ratios. In that regard, because the arrangement of the codes within the encoded stream is tailored to facilitate data-parallel processing, threads in a thread group can cooperate to access groups of codes for parallel decoding deterministically and iteratively without requiring metadata that inherently reduces the compression ratio. Furthermore, unlike prior art techniques, because the threads read contiguous words from the encoded sequence and write literals represented by contiguous symbols to the decoded sequence, the decoding throughput is not reduced by sparse memory accesses. And because the thread group incrementally generates the decoded sequence from beginning to end without any gaps, copy codes do not require deferred processing that can adversely impact memory usage and decoding throughput in some prior-art techniques. These technical advantages provide one or more technological improvements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

Figure 1:
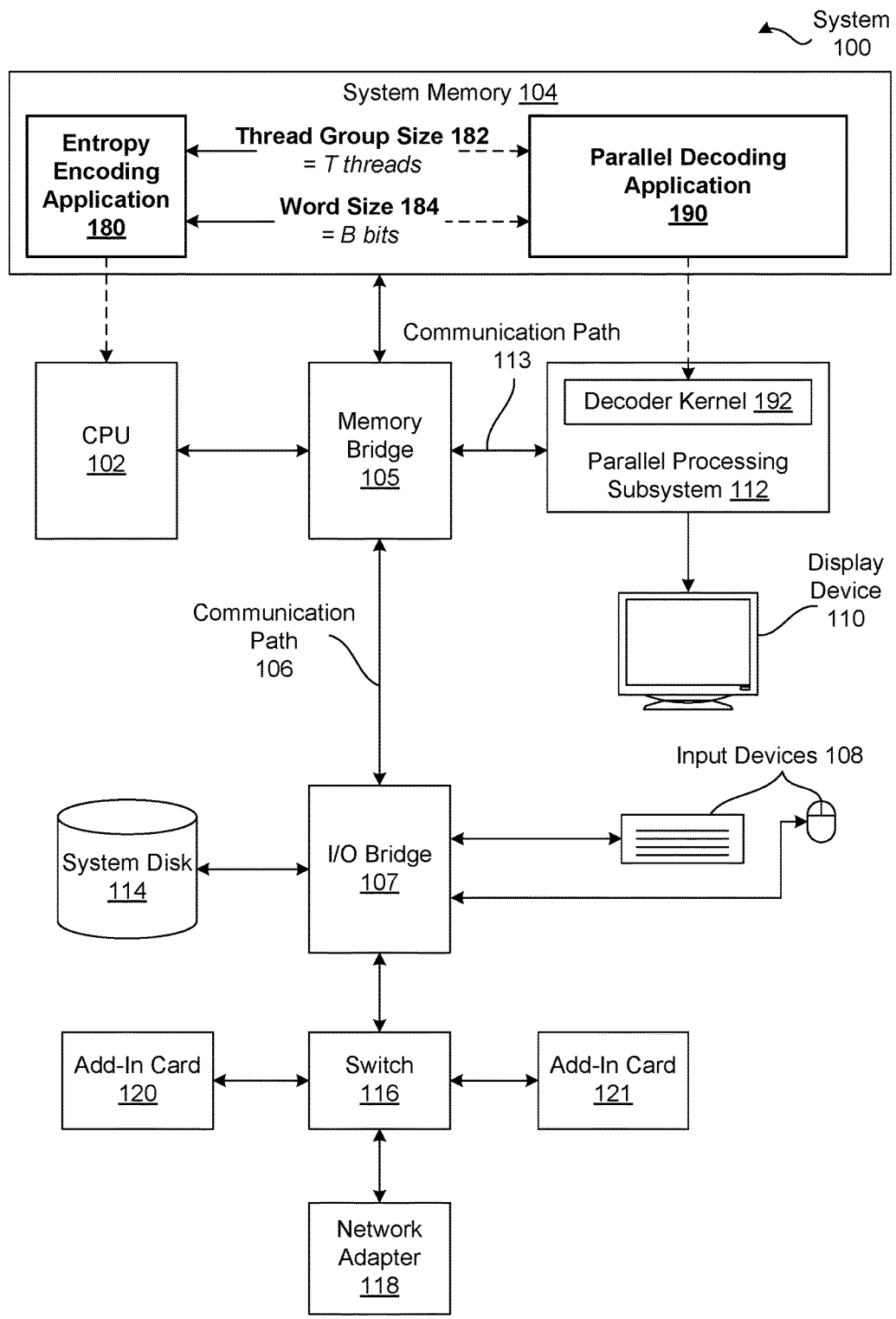
FIG. 1 is a block diagram illustrating a system configured to implement one or more aspects of the present disclosure.

In the following description, numerous specific details are set forth to provide a more thorough understanding of the various embodiments. However, it will be apparent to one skilled in the art that the inventive concepts may be practiced without one or more of these specific details.

As described previously herein, one challenge associated with decoding encoded sequences that include variable-length codes is that directly addressing and properly decoding specific codes within an encoded sequence in a non-serial fashion is problematic. In one conventional approach to data-parallel decoding, a subsequence-based encoding algorithm partitions a given sequence into symbol-aligned encoded subsequences and generates metadata specifying an input pointer for each encoded subsequence included in the encoded sequence. A subsequence-based decoding algorithm uses the metadata to configure multiple threads to decode the encoded subsequences in parallel.

On drawback of the above conventional subsequence-based approach to data-parallel decoding is that transmitting and storing the metadata reduces the compression ratio. Another drawback is that because the threads end up accessing memory sparsely when reading from the encoded sequence and when writing to the decoded sequence, the decoding throughput can be decreased. Yet another drawback of the conventional subsequence-based approach to data-parallel decoding is that because the decoded sequence can include gaps, the subsequence-based decoding application can be forced to store copy codes for deferred processing, thereby consuming additional memory and further decreasing decoding throughput.

To address the above problems, an entropy encoding application 180 systematically rearranges the bits in encoded sequences relative to the corresponding symbols representing the source sequences to facilitate data-parallel decoding. In this fashion, the entropy encoding application 180 institutes a coding format that renders encoded sequences amenable to decoding using a group of threads or "thread group" executing in parallel. As used herein, a "thread" can be a software thread or a hardware thread.

A "software thread" refers to a thread of execution executing on any type of processing unit. For explanatory purposes only, a group of software threads that decodes an encoded sequence generated by the entropy encoding application 180 is also referred to herein as a "decoding thread group." A "hardware thread" refers to an independent hardware process that can be implemented via any number and/or types of fixed-function hardware units (e.g., a copy engine). For explanatory purposes only, a group of one or more fixed-function hardware units that decodes an encoded sequence generated by the entropy encoding application 180 is also referred to herein collectively as a "parallel decoding unit."

In general, the entropy encoding application 180 can execute on any type of processing system, and the resulting encoded sequence can be decoded via a decoding thread group or a parallel decoding unit included in the same processing system of a different processing system. For instance, in some embodiments, both the entropy encoding application 180 and a parallel decoding application 190 execute on a multi-core processor. The entropy encoding application 180 generates an encoded sequence. To decode the encoded sequence, the parallel decoding application 190 causes a decoding thread group to execute across multiple cores included in the multi-core processor. Some examples of multi-core processors include, without limitation, certain types of central processing units ("CPUs"), graphics processing units ("GPUs"), parallel processing units ("PPUs"), and accelerated processing units (*"APUs").

For explanatory purposes only, the functionality of the entropy encoding application 180, the parallel decoding application 190, the decoding thread group, and the parallel decoding unit are described below in conjunction with FIGS. 1-6 in the context of some other embodiments that are implemented within a system 100. The system 100 includes, without limitation, a CPU 102 and a parallel processing subsystem 102 that includes any number of PPUs. As described in greater detail below, in the embodiments depicted in FIGS. 1-6, the entropy encoding application 180 executes on the CPU 102 to generate an encoded sequence. In some embodiments, to decode the encoded sequence, the parallel decoding application 190 causes a decoding thread group to execute on a streaming multiprocessor ("SM") included in one of the PPUs. In some other embodiments, the parallel decoding application 190 can be omitted from the system 100 and, as depicted in FIG. 2, a parallel decoding unit included in the PPU decodes the encoded sequence.

Note that the techniques described herein are illustrative rather than restrictive and may be altered without departing from the broader spirit and scope of the invention. Many modifications and variations on the functionality provided by the entropy encoding application 180, the parallel decoding application 190, the decoding thread group, and the parallel decoding unit will be apparent to those of ordinary skill in the art without departing from the scope and spirit of the described embodiments.

Exemplar System Overview

Figure 2:
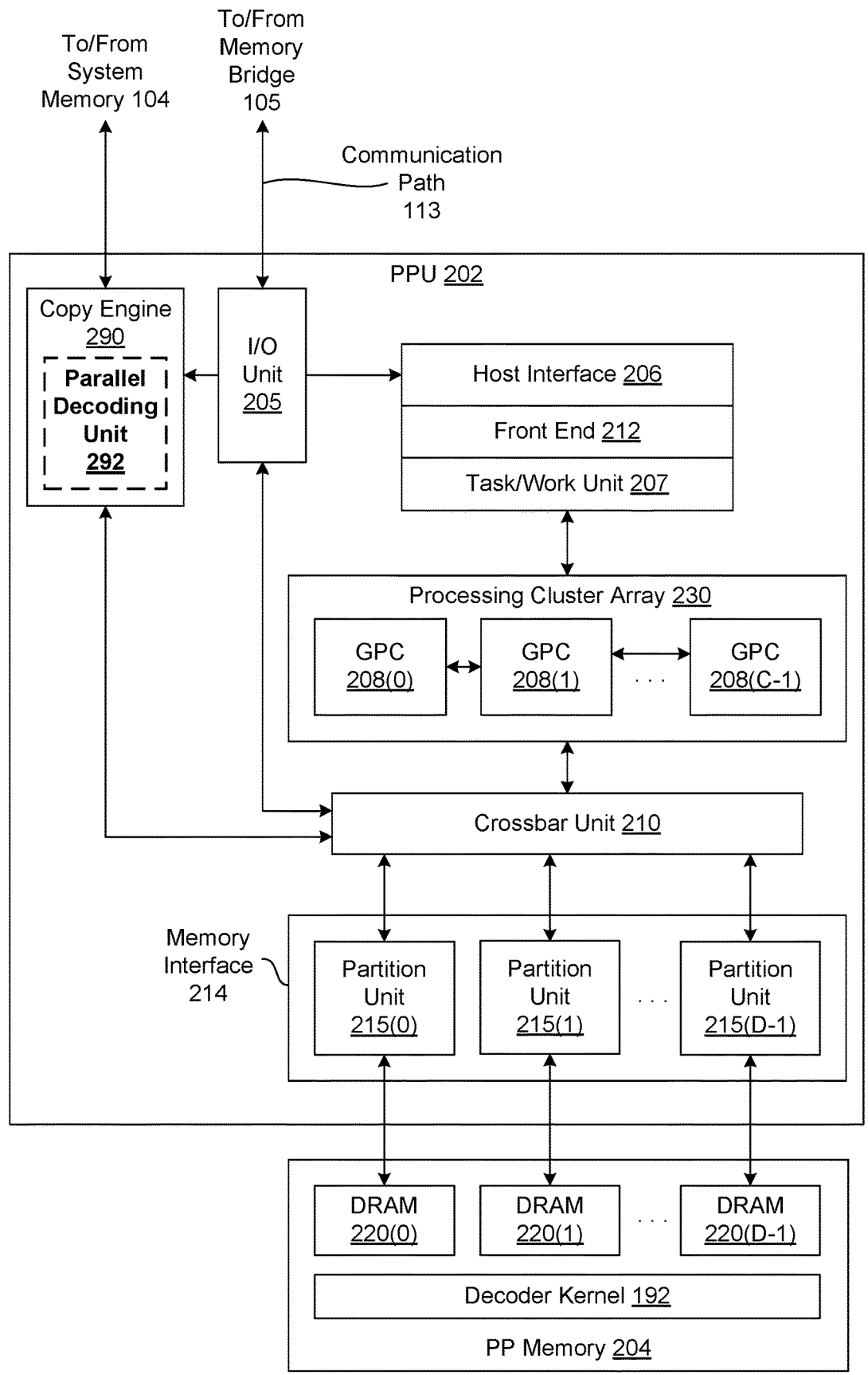
FIG. 2 is a block diagram of a parallel processing unit included in the parallel processing subsystem of FIG. 1, according to various embodiments.

FIG. 1 is a block diagram illustrating a system 100 configured to implement one or more aspects of the present disclosure. As shown, the system 100 includes, without limitation, a central processing unit ("CPU") 102 and a system memory 104 coupled to a parallel processing subsystem 112 via a memory bridge 105 and a communication path 113. The memory bridge 105 is further coupled to an input/output ("I/O") bridge 107 via a communication path 106, and the I/O bridge 107 is, in turn, coupled to a switch 116.

In operation, the I/O bridge 107 is configured to receive user input information from input devices 108, such as a keyboard or a mouse, and forward the input information to the CPU 102 for processing via the communication path 106 and the memory bridge 105. The switch 116 is configured to provide connections between the I/O bridge 107 and other components of the system 100, such as a network adapter 118 and add-in cards 120 and 121.

As also shown, the I/O bridge 107 is coupled to a system disk 114 that can be configured to store content and applications and data for use by the CPU 102 and the parallel processing subsystem 112. As a general matter, the system disk 114 provides non-volatile storage for applications and data and can include fixed or removable hard disk drives, flash memory devices, compact disc read-only-memory, digital versatile disc read-only-memory, Blu-ray, high definition digital versatile disc, or other magnetic, optical, or solid state storage devices. Finally, although not explicitly shown, other components, such as universal serial bus or other port connections, compact disc drives, digital versatile disc drives, film recording devices, and the like, can be connected to the I/O bridge 107 as well.

In various embodiments, the memory bridge 105 can be a Northbridge chip, and the I/O bridge 107 can be a Southbrige chip. In addition, the communication paths 106 and 113, as well as other communication paths within the system 100, can be implemented using any technically suitable protocols, including, without limitation, Accelerated Graphics Port, HyperTransport, or any other bus or point-to-point communication protocol known in the art.

In some embodiments, the parallel processing subsystem 112 comprises a graphics subsystem that delivers pixels to a display device 110 that can be any conventional cathode ray tube, liquid crystal display, light-emitting diode display, or the like. In such embodiments, the parallel processing subsystem 112 incorporates circuitry optimized for graphics and video processing, including, for example, video output circuitry. As described in greater detail below in FIG. 2, such circuitry can be incorporated across one or more parallel processing units ("PPUs") included within the parallel processing subsystem 112. In other embodiments, the parallel processing subsystem 112 incorporates circuitry optimized for general purpose and/or compute processing. Again, such circuitry can be incorporated across one or more PPUs included within the parallel processing subsystem 112 that are configured to perform such general purpose and/or compute operations. In yet other embodiments, the one or more PPUs included within the parallel processing subsystem 112 can be configured to perform graphics processing, general purpose processing, and compute processing operations.

In some embodiments, the parallel processing subsystem 112 can be integrated with one or more other the other elements of FIG. 1 to form a single system. For example, the parallel processing subsystem 112 can be integrated with the CPU 102 and other connection circuitry on a single chip to form a system on a chip ("SoC"). In the same or other embodiments, any number of CPUs 102 and any number of parallel processing subsystems 112 can be distributed across any number of shared geographic locations and/or any number of different geographic locations and/or implemented in one or more cloud computing environments (i.e., encapsulated shared resources, software, data, etc.) in any combination.

In some embodiments, the system memory 104 can include, without limitation, any number of software applications, any number of device drivers (not shown), or any combination thereof. Each of the software applications can reside in any number of memories and execute on any number of processors in any combination. As referred to herein, a "processor" can be any instruction execution system, apparatus, or device capable of executing instructions. Some examples of processors include, without limitation, the CPU 102, the parallel processing subsystem 112, and the PPUs.

In some embodiments, at least one device driver is configured to manage the processing operations of the one or more PPUs within the parallel processing subsystem 112. In the same or other embodiments, the device driver implements application programming interface ("API") functionality that enables software applications to specify instructions for execution on the one or more PPUs via API calls.

As shown, in some embodiments, the system memory 104 includes, without limitation, an entropy encoding application 180 and/or a parallel decoding application 190. In some embodiments, the entropy encoding application 180 is a software application that executes on the CPU 102. In some other embodiments, the entropy encoding application 180 is a software application that executes on any number of PPUs included within the parallel processing subsystem 112. In the same or other embodiments, the parallel decoding application 190 is a software application that executes instructions on any number of PPUs included within the parallel processing subsystem 112 and/or any number of other parallel processing subsystems 112 (not shown). In some other embodiments, the parallel decoding application 190 is a software application that executes on the CPU 102.

In some embodiments, the entropy encoding application 180 executes on an instance of the CPU 102 that is included in a server device and any number of instances of the entropy encoding application 180 execute on any number of instances of the parallel processing subsystem 112 distributed across any number of client devices located in different geographic locations.

In some embodiments, the entropy encoding application 180 encodes source sequences (not shown in FIG. 1) to generate encoded sequences (not shown in FIG. 1) that reduce the resources required to store and transmit the source sequences without incurring any information loss. As referred to herein, a "sequence" can be any sequence of any number and/or types of discrete portions of data. Some examples of sequences include, without limitation, bitstreams and bytestreams.

For explanatory purposes only, discrete portions of data included in a source sequence are referred to herein as "literals" and are represented by "symbols." In some embodiments, each literal is a byte or an alphabetic character. In the same or other embodiments, each symbol is either a literal symbol or a copy symbol, where each literal symbol represents a single literal, and each copy symbol represents a copy that generates a string of literals. More precisely, in some embodiments, a copy symbol is a back-reference specifying the location and length of an original sequence of literals that is identical to and proceeds the associated sequence of literals in the source sequence.

As part of generating the encoded sequence for a given source sequence, the entropy encoding application 180 maps each symbol included in the given encoded sequence to a variable-length code based, at least in part, on entropy encoding techniques. As referred to herein, each "code" can be any discrete portion of data and different codes can be associated with different code types. Furthermore, a group of symbols is mapped to a group of variable-length codes, containing as many codes as there are symbols in the group of symbols. In some embodiments, the lengths of the codes vary inversely to the frequency of the corresponding symbols representing the associated source sequence.

Enabling Efficient Data-Parallel Decoding

As outlined previously herein, to address problems that can be associated with conventional approaches to data-parallel decoding, the entropy encoding application 180 systematically rearranges the bits of encoded sequences relative to the corresponding symbols representing the source sequences to facilitate data-parallel decoding. In this fashion, the entropy encoding application 180 institutes a coding format that renders encoded sequences amenable to decoding using a thread group executing in parallel. Again, as used herein, a thread can be a software thread or a hardware thread.

In some embodiments, each of the threads in a thread group is associated with a different thread identifier ("ID") that uniquely identifies the thread within the thread group. In some embodiments, any number and/or types of techniques (e.g., predication) can be used to disable one or more of the threads in a thread group for any period of time. In the same or other embodiments, the threads in a thread group can synchronize together, collaborate, communicate, or any combination thereof in any technically feasible fashion (e.g., via a shared memory).

In some embodiments, a thread group can be configured to decode a given encoded sequence based on single-instruction, multiple-data ("SIMD") model in which each thread processes a different set of data based on a single set of instructions. A thread group that is configured based on a SIMD model is also referred to herein as "a SIMD thread group." In some embodiments, the threads in a SIMD thread group execute in lock-step. In some other embodiments, a thread group can be configured to decode a given encoded sequence based on single-instruction, multiple-thread ("SIMT") model that, relative to a SIMD model allows different threads to more readily follow divergent execution paths.

As shown, in some embodiments, the entropy encoding application 180 encodes each of any number of source sequences based on a thread group size 182 and a word size 184. For explanatory purposes only, the functionality of the entropy encoding application 180 is described herein in the context of encoding a single source sequence to generate a corresponding encoded sequence. However, the thread group size 182 and the word size 184 can be used to encode any number of source sequences and can therefore be common to any number of encoded sequences.

The thread group size 182 specifies the total number of threads that are to be available for decoding the encoded sequence generated by the entropy encoding application 180. The thread group size 182 can be any integer greater than one and can be determined in any technically feasible fashion. For instance, in some embodiments, the thread group size 182 can be determined based on the architecture of the parallel processing subsystem 112.

In some embodiments, the entropy encoding application 180 formats the encoded sequence such that a thread group having the thread group size 182 can iteratively determine groups of symbols and store the corresponding groups of literals in contiguous memory to incrementally generate the decoded sequence from beginning to end without any gaps. For explanatory purposes only, an "decoding iteration" refers to a sequence of steps during which the threads in the thread group concurrently acquire different codes based on the encoded sequence, concurrently decode the codes to generate the corresponding symbols, and concurrently store the literals represented by the symbols in contiguous memory.

In the same or other embodiments, the entropy encoding application 180 can indicate implicitly or explicitly the number of threads that are to be used to process any portion of the encoded sequence during decoding in any technically feasible fashion. For instance, in some embodiments, each block of the encoded sequence is associated with data-parallel processing (e.g., a compressed block) or serial processing (e.g., a header block). During decoding, all threads included in a thread group having the thread group size 182 process the blocks associated with data-parallel processing and a single thread in the thread group processes the blocks associated with serial processing.

In some embodiments, the word size 184 specifies the size of fixed-size words also referred to herein as "words" into which the entropy encoding application 180 packs the codes representing the symbols in the source sequence. In the same or other embodiments, each word is associated with one thread, and each thread is associated with multiple words. The entropy encoding application 180 then aggregates the words to generate the encoded sequence. As a result, the encoded sequence is a linear array of fixed-sized words.

The word size 184 can specify any integer number of bits and can be determined in any technically feasible fashion. In some embodiments, the word size 184 can be determined based on the architecture of the parallel processing subsystem 112. For instance, in some embodiments, the word size 184 is set to the number of bits that the parallel processing subsystem 112 can read from memory using a single read operation (e.g., 32 bits, 64 bits, etc.).

As shown, the thread group size 182 is symbolized as "T" and the word size 184 is symbolized as "B." For explanatory purposes only, numbering with respect to the entropy encoding application 180 and the entropy decoding application 180 is zero-based. Accordingly, the thread IDs associated with a thread group having the thread group size 182 range from 0 to (T-1). And the initial decoding iteration is the zeroth iteration.

In some embodiments, to encode the source sequence, the entropy encoding application 180 executes any number and/or types of encoding algorithms to map the symbols representing the literals included in the source sequence to a sequence of codes. The entropy encoding application 180 then repeatedly assigns contiguous groups of T codes to T thread IDs. Each contiguous group of T codes corresponds to a different decoding iteration. In this fashion, in some embodiments, the entropy encoding application 180 assigns the $x^{th}$ code with respect to the source sequence to the thread corresponding to the thread ID of x % T for decoding during the floor(x/T) decoding iteration. The $x^{th}$ symbol is therefore determined by the thread corresponding to the thread ID of x % T.

For instance, if the thread group size 182 is 32, then the entropy encoding application 180 assigns the $0^{th}$ to $31^{st}$ codes with respect to the source sequence to the threads corresponding to the thread IDs 0-31, respectively, for decoding during the $0^{th}$ decoding iteration. The entropy encoding application 180 then assigns the $32^{nd}$ to $63^{rd}$ codes with respect to the source sequence to the threads corresponding to the thread IDs 0-31, respectively, for decoding during the 1st decoding iteration, and so forth.

In some embodiments, the entropy encoding application 180 packs the codes into words having the word size 184 and then generates the encoded sequence based on the words. In operation, for each of the thread IDs, the entropy encoding application packs the bits for the assigned codes into words that each have B bits in order of increasing decoding iteration. Notably, each word can begin and/or end with partial codes. For example, if B is 16 bits and the lengths in bits of the first seven codes assigned to a given thread ID are, sequentially with respect to the source sequence, 6, 5, 3, 4, 1, 8, and 5, then the entropy encoding application 180 generates one word that includes the first three codes and the first half of the fourth code and another word that includes the second half of the fourth code and the next three codes.

For explanatory purposes only, the decoding iteration of a given word refers to the lowest decoding iteration associated with first code included in the word. To generate the encoded sequence, the entropy encoding application arranges the words based on a primary criterion of increasing decoding iteration and a secondary criterion of increasing thread ID. An example of an encoded sequence that the entropy encoding application 180 generates based on both the thread group size 182 and the word size 184 is described in greater detail below in conjunction with FIG. 5.

In some embodiments, the parallel decoding application 190 decodes any number of encoded sequences that are formatted for data-parallel decoding as described above with respect to the entropy encoding application 180. The parallel decoding application 190 can acquire (e.g., receive, read from memory, etc.) the encoded sequences from any number and/or types of devices internal or external to the system 100 in any technically feasible fashion. In some embodiments, the parallel decoding application 190 can receive any number of encoded sequences generated by any number of instances of the entropy encoding application 180 executing on any number and/or types of processors. In the same or other embodiments, the entropy encoding application 180 is omitted form the system 100.

In some embodiments, the parallel decoding application 190 decodes each of the encoded sequences based on the thread group size 182 and optionally the word size 184. The parallel decoding application 190 can determine the thread group size 182 and the word size 184 in any technically feasible fashion. For instance, in some embodiments, the thread group size 182 and the word size 184 are defined based on the architecture of the parallel processing subsystem 112.

For explanatory purposes only, the functionality of the parallel decoding application 190 is described herein in the context of decoding a single encoded sequence to generate a corresponding decoded sequence. However, the thread group size 182 and the word size 184 can be common to any number of encoded sequences and the parallel decoding application 190 can therefore use the thread group size 182 and the word size 184 to decode any number of encoded sequences.

In some embodiments, the parallel decoding application 190 configures the threads in a thread group having the thread group size 182 and executing on a processor (e.g., a multithreaded processor included in the parallel processing subsystem 112) to decode the encoded sequence in parallel. In the same or other embodiments, the parallel decoding application 190 can dynamically adjust the number of threads (e.g., disable one or more threads in a thread group having the thread group size 182) that the parallel decoding application 190 uses to decode different portions of the encoded sequence based on any amount and/or type of criteria. For instance, in some embodiments, the parallel decoding application 190 can configure all threads in the decoding thread group to process blocks associated with data-parallel processing (e.g., compressed blocks) and can configure a single thread in the decoding thread group to process blocks associated with serial processing (e.g., header blocks).

The parallel decoding application 190 can configure a thread group to decode the encoded sequence in any technically feasible fashion. In some embodiments, the parallel decoding application 190 configures a group of T threads to each execute a different instance of a decoder kernel 192 in SIMD fashion, thereby generating a decoding thread group (not shown in FIG. 1). As shown, in some embodiments, the decoder kernel 192 resides in memory included in the parallel processing subsystem 112. More specifically, in some embodiments, the decoder kernel 192 resides in a parallel processing ("PP") memory that is coupled to one of the PPUs included within the parallel processing subsystem 112. The PPU and the PP memory are described below in conjunction with FIG. 2. The decoding thread group is described in detail below in conjunction with FIGS. 4 and 5.

In some embodiments, any portion (including all) of the functionality of the entropy encoding application 180 as described herein can be implemented in hardware. In the same or other embodiments, the entropy encoding application 180 is omitted from the system 100. In some embodiments, any portion (including all) of the functionality of the parallel decoding application 190 as described herein can be implemented in fixed-function hardware that is capable of executing multiple hardware threads. As described in greater detail below in conjunction with FIG. 2, in some embodiments, a fixed-function parallel decoding unit (not shown in FIG. 1) implements the functionality of the parallel decoding application 190 and the decoding thread group. In the same or other embodiments, the parallel encoding application 190 is omitted form the system 100.

Note that the techniques described herein are illustrative rather than restrictive and may be altered without departing from the broader spirit and scope of the invention. Many modifications and variations on the functionality provided by the entropy encoding application 180, the parallel decoding application 190, and the decoder kernel 192 will be apparent to those of ordinary skill in the art without departing from the scope and spirit of the described embodiments.

It will be appreciated that the system shown herein is illustrative and that variations and modifications are possible. The connection topology, including the number and arrangement of bridges, the number of the CPUs 102, and the number of the parallel processing subsystems 112, can be modified as desired. For example, in some embodiments, the system memory 104 can be connected to the CPU 102 directly rather than through the memory bridge 105, and other devices can communicate with the system memory 104 via the memory bridge 105 and the CPU 102. In other alternative topologies, the parallel processing subsystem 112 can be connected to the I/O bridge 107 or directly to the CPU 102, rather than to the memory bridge 105. In still other embodiments, the I/O bridge 107 and the memory bridge 105 can be integrated into a single chip instead of existing as one or more discrete devices. Lastly, in certain embodiments, one or more components shown in FIG. 1 may not be present. For example, the switch 116 could be eliminated, and the network adapter 118 and the add-in cards 120, 121 would connect directly to the I/O bridge 107.

FIG. 2 is a block diagram of a parallel processing unit ("PPU") 202 included in the parallel processing subsystem 112 of FIG. 1, according to various embodiments. Although FIG. 2 depicts one PPU 202, as indicated above, the parallel processing subsystem 112 can include any number of PPUs 202. As shown, the PPU 202 is coupled to a local PP memory 204. The PPU 202 and the PP memory 204 can be implemented using one or more integrated circuit devices, such as programmable processors, application specific integrated circuits, or memory devices, or in any other technically feasible fashion.

In some embodiments, the PPU 202 comprises a graphics processing unit that can be configured to implement a graphics rendering pipeline to perform various operations related to generating pixel data based on graphics data supplied by the CPU 102 and/or the system memory 104. When processing graphics data, the PP memory 204 can be used as graphics memory that stores one or more conventional frame buffers and, if needed, one or more other render targets as well. Among other things, the PP memory 204 can be used to store and update pixel data and deliver final pixel data or display frames to the display device 110 for display. In some embodiments, the PPU 202 also can be configured for general-purpose processing and compute operations.

As described previously herein in conjunction with FIG. 1, in some embodiments, the system 100 includes parallel decoding application 190 that configures a group of T threads to each execute a different instance of the decoder kernel 192 in SIMD fashion, thereby generating a decoding thread group. As shown, in the same or other embodiments, the decoder kernel 192 resides in the PP memory 204.

In operation, the CPU 102 is the master processor of the system 100, controlling and coordinating operations of other system components. In particular, the CPU 102 issues commands that control the operation of the PPU 202. In some embodiments, the CPU 102 writes a stream of commands for the PPU 202 to a data structure (not explicitly shown in either FIG. 1 or FIG. 2) that can be located in the system memory 104, the PP memory 204, or another storage location accessible to both the CPU 102 and the PPU 202. A pointer to the data structure is written to a pushbuffer to initiate processing of the stream of commands in the data structure. The PPU 202 reads command streams from the pushbuffer and then executes commands asynchronously relative to the operation of the CPU 102. In embodiments where multiple pushbuffers are generated, execution priorities can be specified for each pushbuffer by an application program via a device driver (not shown) to control scheduling of the different pushbuffers.

As also shown, the PPU 202 includes an I/O unit 205 that communicates with the rest of system 100 via the communication path 113 and the memory bridge 105. The I/O unit 205 generates packets (or other signals) for transmission on the communication path 113 and also receives all incoming packets (or other signals) from the communication path 113, directing the incoming packets to appropriate components of the PPU 202. For example, commands related to processing tasks can be directed to a host interface 206, while commands related to memory operations (e.g., reading from or writing to the PP memory 204) can be directed to a crossbar unit 210. The host interface 206 reads each pushbuffer and transmits the command stream stored in the pushbuffer to a front end 212.

In some embodiments, the I/O unit 205 transmits commands to a copy engine 290. In the same or other embodiments, the copy engine 290 implements any number and/or types of memory operations including, without limitation, any number and/or types of direct memory access operations. In some embodiments, the copy engine can copy data from one memory to another memory and/or move data within memory. In the same or other embodiments, the copy engine 290 performs any number and/or type of operations that enable any number of components of the PPU 202 to access the system memory 104 independently of the CPU 102.

As depicted with a dashed box, in some embodiments, the copy engine 290 includes, without limitation, a parallel decoding unit 292. In some other embodiments, the parallel decoding unit 292 can be implemented in any component of the PPU 202 or as a stand-alone unit in the PPU 202. The parallel decoding unit 292 can implement any portion (including all) of the functionality of the parallel decoding application 190 and/or the decoding thread group as described herein in any technically feasible fashion. In some embodiments, the parallel decoding unit 292 includes, without limitation, one or more fixed-function hardware units that are collectively and/or individually capable of executing any number of hardware threads to efficiently decode encoded sequences in parallel.

As mentioned above in conjunction with FIG. 1, the connection of the PPU 202 to the rest of system 100 can be varied. In some embodiments, the parallel processing subsystem 112, which includes at least one PPU 202, is implemented as an add-in card that can be inserted into an expansion slot of the system 100. In some other embodiments, the PPU 202 can be integrated on a single chip with a bus bridge, such as the memory bridge 105 or the I/O bridge 107. Again, in still other embodiments, some or all of the elements of the PPU 202 can be included along with the CPU 102 in a single integrated circuit or system on a chip.

In operation, the front end 212 transmits processing tasks received from the host interface 206 to a work distribution unit (not shown) within a task/work unit 207. The work distribution unit receives pointers to processing tasks that are encoded as task metadata ("TMD") and stored in memory. The pointers to TMDs are included in a command stream that is stored as a pushbuffer and received by the front end 212 from the host interface 206. Processing tasks that can be encoded as TMDs include indices associated with the data to be processed as well as state parameters and commands that define how the data is to be processed. For example, the state parameters and commands could define the program to be executed on the data. The task/work unit 207 receives tasks from the front end 212 and ensures that general processing clusters ("GPCs") 208 are configured to a valid state before the processing task specified by each one of the TMDs is initiated. A priority can be specified for each TMD that is used to schedule the execution of the processing task. Processing tasks also can be received from a processing cluster array 230. Optionally, the TMD can include a parameter that controls whether the TMD is added to the head or the tail of a list of processing tasks (or to a list of pointers to the processing tasks), thereby providing another level of control over execution priority.

The PPU 202 advantageously implements a highly parallel processing architecture based on the processing cluster array 230 that includes a set of C GPCs 208, where C≥1. Each of the GPCs 208 is capable of executing a large number (e.g., hundreds or thousands) of threads concurrently, where each thread is an instance of a program (e.g., a kernel). In various applications, different GPCs 208 can be allocated for processing different types of programs or for performing different types of computations. The allocation of the GPCs 208 can vary depending on the workload arising for each type of program or computation.

Memory interface 214 includes a set of D partition units 215, where D≥1. Each of the partition units 215 is coupled to one or more dynamic random access memories ("DRAMs") 220 residing within the PP memory 204. In some embodiments, the number of the partition units 215 equals the number of the DRAMs 220, and each of the partition units 215 is coupled to a different one of the DRAMs 220. In some other embodiments, the number of the partition units 215 can be different than the number of the DRAMs 220. Persons of ordinary skill in the art will appreciate that the DRAM 220 can be replaced with any other technically suitable storage device. In operation, various render targets, such as texture maps and frame buffers, can be stored across the DRAMs 220, allowing the partition units 215 to write portions of each render target in parallel to efficiently use the available bandwidth of the PP memory 204.

A given GPC 208 can process data to be written to any of the DRAMs 220 within the PP memory 204. The crossbar unit 210 is configured to route the output of each GPC 208 to the input of any partition unit 215 or to any other GPC 208 for further processing. The GPCs 208 communicate with the memory interface 214 via the crossbar unit 210 to read from or write to any number of the DRAMs 220. In one embodiment, the crossbar unit 210 has a connection to the I/O unit 205 in addition to a connection to the PP memory 204 via the memory interface 214, thereby enabling the processing cores within the different GPCs 208 to communicate with the system memory 104 or other memory not local to the PPU 202. In the embodiment of FIG. 2, the crossbar unit 210 is directly connected with the I/O unit 205. In various embodiments, the crossbar unit 210 can use virtual channels to separate traffic streams between the GPCs 208 and the partition units 215.

Again, the GPCs 208 can be programmed to execute processing tasks relating to a wide variety of applications, including, without limitation, linear and nonlinear data transforms, filtering of video and/or audio data, modeling operations (e.g., applying laws of physics to determine position, velocity and other attributes of objects), image rendering operations (e.g., tessellation shader, vertex shader, geometry shader, and/or pixel/fragment shader programs), general compute operations, etc. In operation, the PPU 202 is configured to transfer data from the system memory 104 and/or the PP memory 204 to one or more on-chip memory units, process the data, and write result data back to the system memory 104 and/or the PP memory 204. The result data can then be accessed by other system components, including the CPU 102, another PPU 202 within the parallel processing subsystem 112, or another parallel processing subsystem 112 within the system 100.

As noted above, any number of the PPUs 202 can be included in the parallel processing subsystem 112. For example, multiple PPUs 202 can be provided on a single add-in card, or multiple add-in cards can be connected to the communication path 113, or one or more of the PPUs 202 can be integrated into a bridge chip. The PPUs 202 in a multi-PPU system can be identical to or different from one another. For example, different PPUs 202 might have different numbers of processing cores and/or different amounts of the PP memory 204. In implementations where multiple PPUs 202 are present, those PPUs 202 can be operated in parallel to process data at a higher throughput than is possible with a single PPU 202. Systems incorporating one or more PPUs 202 can be implemented in a variety of configurations and form factors, including, without limitation, desktops, laptops, handheld personal computers or other handheld devices, servers, workstations, game consoles, embedded systems, and the like.

Figure 3:
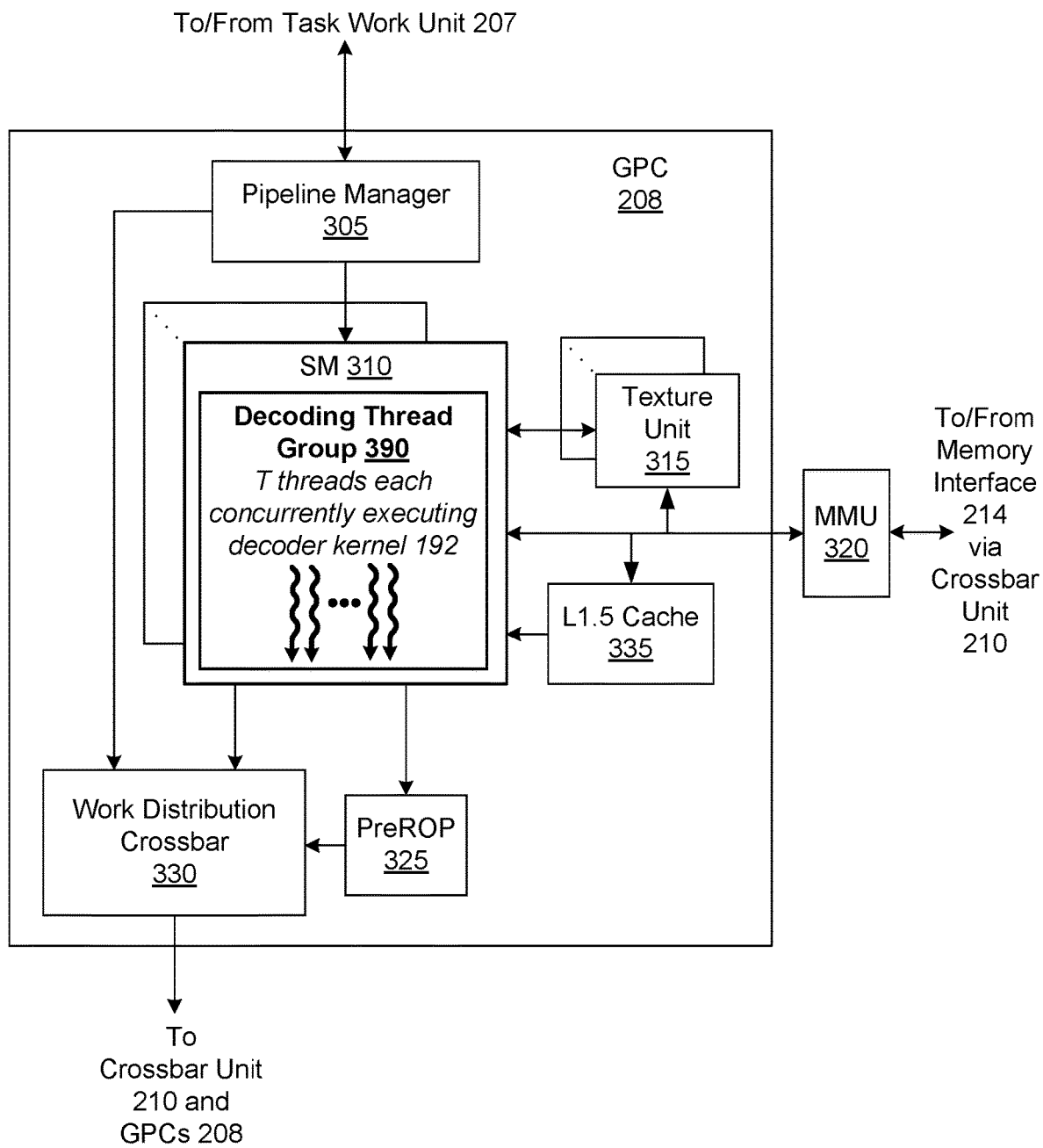
FIG. 3 is a block diagram of a general processing cluster included in the parallel processing unit of FIG. 2, according to various embodiments.

FIG. 3 is a block diagram of a GPC 208 included in the PPU 202 of FIG. 2, according to various embodiments. In operation, the GPC 208 can be configured to execute a large number of software threads in parallel to perform graphics, general processing and/or compute operations. In some embodiments, each software thread executing on the GPC 208 is an instance of a particular program executing on a particular set of input data. In some embodiments, SIMD instruction issue techniques are used to support parallel execution of a large number of threads without providing multiple independent instruction units. In some other embodiments, SIMT techniques are used to support parallel execution of a large number of generally synchronized threads, using a common instruction unit configured to issue instructions to a set of processing engines within GPC 208. Unlike a SIMD execution regime, where all processing engines typically execute identical instructions, SIMT execution allows different threads to more readily follow divergent execution paths through a given program. Persons of ordinary skill in the art will understand that a SIMD processing regime represents a functional subset of a SIMT processing regime.

Operation of the GPC 208 is controlled via a pipeline manager 305 that distributes processing tasks received from a work distribution unit (not shown) within the task/work unit 207 to one or more SMs 310. The pipeline manager 305 can also be configured to control a work distribution crossbar 330 by specifying destinations for processed data output by the SMs 310.

In some embodiments, the GPC 208 includes, without limitation, a set of M of the SMs 310, where M≥1. In the same or other embodiments, each of the SMs 310 includes, without limitation, a set of functional units (not shown), such as execution units and load-store units. Processing operations specific to any of the functional units can be pipelined, which enables a new instruction to be issued for execution before a previous instruction has completed execution. Any combination of functional units within a given SM 310 can be provided. In various embodiments, the functional units can be configured to support a variety of different operations including integer and floating point arithmetic (e.g., addition and multiplication), comparison operations, Boolean operations (e.g., AND, OR, XOR), bit-shifting, and computation of various algebraic functions (e.g., planar interpolation and trigonometric, exponential, and logarithmic functions, etc.). Advantageously, the same functional unit can be configured to perform different operations.

In operation, each of the SMs 310 is configured to process one or more thread groups. In the context of the SM 310, a "thread group" or "warp" refers to a group of threads concurrently executing the same program on different input data, with each thread of the group being assigned to a different execution unit within the SM 310. A thread group can include fewer threads than the number of execution units within the SM 310, in which case some of the execution units can be idle during cycles when that thread group is being processed. A thread group can also include more threads than the number of execution units within the SM 310, in which case processing can occur over consecutive clock cycles. Since each of the SMs 310 can support up to G thread groups concurrently, it follows that up to G*M thread groups can be executing in the GPC 208 at any given time.

Additionally, a plurality of related thread groups can be active (in different phases of execution) at the same time within an SM 310. This collection of thread groups is referred to herein as a "cooperative thread array" ("CTA") or "thread array." The size of a particular CTA is equal to m*k, where k is the number of concurrently executing threads in a thread group, which is typically an integer multiple of the number of execution units within the SM 310, and m is the number of thread groups simultaneously active within the SM 310.

In some embodiments, each of the threads in a given thread group is assigned a unique thread ID that is accessible to the thread during the thread's execution. The thread ID, which can be defined as a one-dimensional or multi-dimensional numerical value controls various aspects of the thread's processing behavior. For instance, a thread ID may be used to determine which portion of the input data set a thread is to process and/or to determine which portion of an output data set a thread is to produce or write.

Although not shown in FIG. 3, each of the SMs 310 contains a level one ("L1") cache or uses space in a corresponding L1 cache outside of the SM 310 to support, among other things, load and store operations performed by the execution units. Each of the SMs 310 also has access to level two ("L2") caches (not shown) that are shared among all the GPCs 208 in the PPU 202. In some embodiments, the L2 caches can be used to transfer data between threads. Finally, the SMs 310 also have access to off-chip "global" memory, which can include the PP memory 204 and/or the system memory 104. It is to be understood that any memory external to the PPU 202 can be used as global memory. Additionally, as shown in FIG. 3, a level one-point-five ("L1.5") cache 335 can be included within the GPC 208 and configured to receive and hold data requested from memory via the memory interface 214 by the SM 310. Such data can include, without limitation, instructions, uniform data, and constant data. In embodiments having multiple SMs 310 within the GPC 208, the SMs 310 can beneficially share common instructions and data cached in L1.5 cache 335.

Each of the GPCs 208 can have an associated memory management unit ("MMU") 320 that is configured to map virtual addresses into physical addresses. In various embodiments, the MMU 320 can reside either within the GPC 208 or within the memory interface 214. The MMU 320 includes a set of page table entries ("PTEs") used to map a virtual address to a physical address of a tile or memory page and optionally a cache line index. The MMU 320 can include address translation lookaside buffers ("TLB") or caches that can reside within the SMs 310, within one or more L1 caches, or within the GPC 208.

In graphics and compute applications, the GPC 208 can be configured such that each of the SMs 310 is coupled to a texture unit 315 for performing texture mapping operations, such as determining texture sample positions, reading texture data, and filtering texture data.

In operation, each of the SMs 310 transmits a processed task to the work distribution crossbar 330 in order to provide the processed task to another GPC 208 for further processing or to store the processed task in an L2 cache (not shown), the PP memory 204, or the system memory 104 via the crossbar unit 210. In addition, a pre-raster operations ("preROP") unit 325 is configured to receive data from the SM 310, direct data to one or more raster operations ("ROP") units within the partition units 215, perform optimizations for color blending, organize pixel color data, and perform address translations.

It will be appreciated that the core architecture described herein is illustrative and that variations and modifications are possible. Among other things, any number of processing units, such as the SMs 310, the texture units 315, or the preROP units 325, can be included within the GPC 208. Further, as described above in conjunction with FIG. 2, the PPU 202 can include any number of the GPCs 208 that are configured to be functionally similar to one another so that execution behavior does not depend on which of the GPCs 208 receives a particular processing task. Further, each of the GPCs 208 operates independently of the other GPCs 208 in the PPU 202 to execute tasks for one or more application programs. In view of the foregoing, persons of ordinary skill in the art will appreciate that the architecture described in FIGS. 1-3 in no way limits the scope of the present disclosure.

As shown, in some embodiments, one of the SMs 310 is configured to process a decoding thread group 390. The decoding thread group 390 is a thread group having the thread group size 182 of T, where each of the T threads in the thread group is concurrently executing the decoder kernel 192 on different data. In some embodiments, each thread of the decoding thread group 390 is assigned to a different execution unit within the SM 310. The decoding thread group 390 can be configured in any technically feasible fashion. As described previously herein in conjunction with FIG. 1, in some embodiments, the parallel decoding application 190 configures the SM 310 to process the decoding thread group 390. For explanatory purposes only, references to the thread(s) as used below refer to the thread(s) of the decoding thread group 390 that are active at any given point in time. The decoding thread group 390 is described in greater detail below in conjunction with FIGS. 4 and 5.

Parallel Decoding Using Shared Input and Output Pointers

Figure 4:
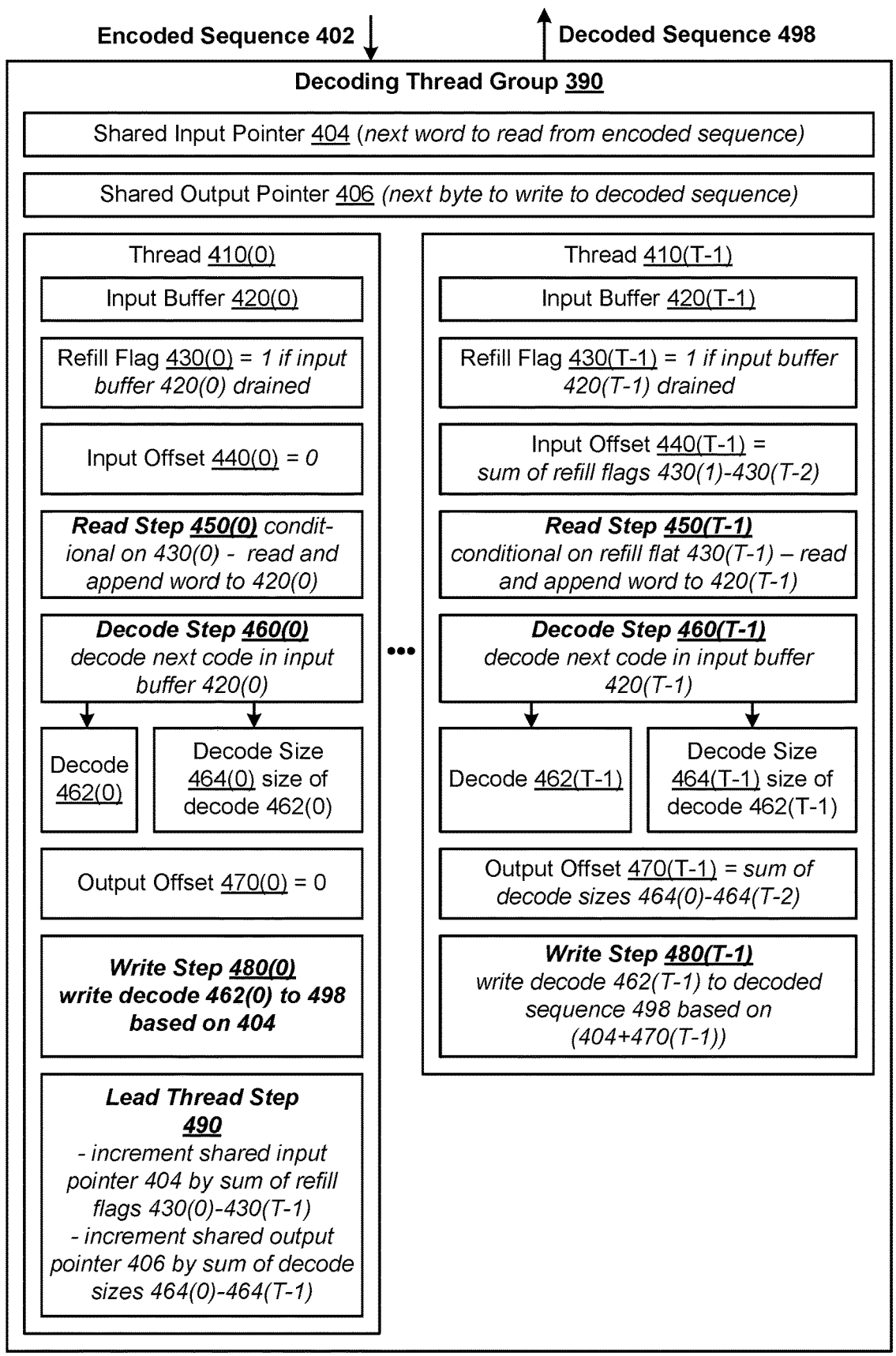
FIG. 4 is a more detailed illustration of the decoding thread group of FIG. 3, according to various embodiments.

FIG. 4 is a more detailed illustration of the decoding thread group 390 of FIG. 3, according to various embodiments. The decoding thread group 390 decodes an encoded sequence 402 to generate a decoded sequence 498. As shown, in some embodiments, the decoding thread group 390 includes, without limitation, threads 410(0)-410(T-1), a shared input pointer 404, and a shared output pointer 406, where T is the thread group size 182. For explanatory purposes only, the thread IDs (not shown) of the threads 410(0)-410(T-1) are 0-(T-1), respectively.

In some embodiments, including the embodiment depicted in FIG. 4, the encoded sequence 402 is formatted for data-parallel processing based on the thread group size 182 that is symbolized as T and the word size 184 that is symbolized as B. Further, the encoded sequence 402 is optimized for a data-parallel decoding process in which threads 410(0)-410(T) each decode a single code from the encoded sequence 402 during each decoding iteration.

In some other embodiments, the encoded sequence 402 can be optimized for a different type of data-parallel processing and/or a different type of data-parallel decoding process, and the techniques described herein are modified accordingly. For instance, in some embodiments, the codes in the encoded sequence 402 are not packed into the fixed-length words and therefore the shared input pointer 404 is replaced with T different input pointers that are provided as metadata, where each of the input pointers is associated with a different thread.

The shared input pointer 404 and the shared output pointer 406 are shared across the threads 410(0)-410(T-1). In some embodiments, at any given point in time, the shared input pointer 404 points to the next word that is to be read from the encoded sequence 402. In the same or other embodiments, at any given point in time, the shared output pointer 406 points to the location within the memory allocated for the decoded sequence 498 immediately following the last literal that the decoding thread group 390 wrote to the decoded sequence 498.

The format of the encoded sequence 402 and the ability of the threads 410 to communicate enables one of the threads 410, referred to herein as "a lead thread," to deterministically advance the shared input pointer 404 and the shared output pointer 406 as the threads 410 decode the encoded sequence 402. The lead thread can be determined in any technically feasible fashion. In some embodiments, the lead thread is the thread 410(0) corresponding to the thread ID of zero.

Importantly, the lead thread advances the shared output pointer 406 in a monotonically increasing fashion from the beginning of the decoded sequence 498 to the end of the decoded sequence 498. In a corresponding fashion, the decoding thread group 390 incrementally generates the decoded sequence 498 from beginning to end without gaps. In some embodiments, including the embodiment depicted in FIG. 4, the lead thread also advances the shared input pointer 404 in a monotonically increasing fashion from the beginning of the encoded sequence 402 to the end of the encoded sequence 402.

Prior to the zeroth iteration, the parallel decoding application 190, the decoding thread group 390, and/or the lead thread initialize the shared input pointer 404 and the shared output pointer to point to the initial word in the encoded sequence 402 and the start of the memory allocated for the decoded sequence 498, respectively. The parallel decoding application 190, the decoding thread group 390, and/or the lead thread can initialize the shared input pointer 404 and the shared output pointer 406 in any technically feasible fashion.

As shown, in some embodiments, the threads 410(0)-410(T-1) include, without limitation, input buffers 420(0)-420(T-1), refill flags 430(0)-430(T-1), input offsets 440(0)-440(T-1), decodes 462(0)-462(T-1), decode sizes 464(0)-464(T-1), and output offsets 470(0)-470(T-1). For an integer t from 0 to (T-1), the input buffer 420(t), the refill flag 430(t), the input offset 440(t), the decode 462(t), the decode size 464(t), and the output offset 470(t) are associated with the thread 410(t) and are also referred to herein collectively as the "thread-specific variables" of the thread 410(t). In some embodiments, each of the threads 410 writes to the thread-specific variables of the thread 410 and reads from any number of the thread-specific variables of any number of the threads 410 (including the thread 410).

In some embodiments, at any given point in time, the input buffer 420(t) stores any number of complete codes and/or any number of partial codes that are assigned to the thread 410(t) that the thread 410(t) has not yet decoded. As needed, the thread 410(t) copies words that are assigned to the thread 410(t) from the encoded sequence 402 to the input buffer 420(t). As needed, the thread 410(t) reads and removes codes from the input buffer 420(t) in a first in, first out fashion. In some embodiments, prior to the zeroth iteration, the parallel decoding application 190 and/or any number of the threads 410 initialize the input buffers 420 to indicate that the input buffers 420 are empty.

The refill flags 430 enable the threads 410 to consume words from the encoded sequence 402 in a deterministic fashion that ensures that each of the threads 410 reads the words assigned to the thread 410 by the entry encoding application 180 during the encoding process. The input offsets 440(0)-440(T-1) are offsets with respect to the shared input pointer 404. The sum of the shared input pointer 404 and the input offset 440(t) is a thread-specific input pointer for the thread 410(t). As described in greater detail below, in some embodiments, the input offset 440(0) is zero and the threads 410(1)-440(T-1) determine the input offsets 440(1)-440(T-1), respectively, based on the refill flags 430.

The decodes 462(0)-462(T-1) store the literal(s) represented by the symbol(s) decoded by the threads 410(0)-410(T-1), respectively, before the threads 410(0)-410(T-1) concurrently write the decodes 462(0)-462(T-1), respectively, to the decoded sequence 498 as a contiguous sequence of literals. In some embodiments, each of the decodes 462 is either a single literal that is decoded based on a literal code or a string of literals that is decoded based on a copy symbol.

The decode sizes 464(0)-464(T-1) specify the size of the decodes 462(0)-462(T-1), respectively. The output offsets 470(0)-470(T-1) are offsets with respect to the shared output pointer 406. The sum of the shared output pointer 406 and the output offset 470(t) is a thread-specific output pointer for the thread 410(t). As described in greater detail below, in some embodiments, the output offset 470(0) is zero and the threads 410(1)-440(T-1) determine the output offsets 470(1)-470(T-1), respectively, based on the decode sizes 464.

In some embodiments, to initiate a new decoding iteration, the threads 410(0)-410(T-1) concurrently determine the refill flags 430(0)-430(T-1), respectively, based on the input buffers 420(0)-420(T-1), respectively. More precisely, the thread 410(t) determines the refill flag 430(t) based on the input buffer 420(t). The thread 410(t) can determine the refill flag 430(t) based on the input buffer 420(t) in any technically feasible fashion. In some embodiments, if the input buffer 420(t) does not include at least one complete code, then the thread 410(t) sets the refill flag 430(t) to 1 to indicate that the input buffer 420(t) is drained of complete signals and requires a refill.

In some other embodiments, if the number of valid bits in the input buffer 420(t) is below a constant threshold, then the thread 410(t) sets the refill flag 430(t) to 1. By setting the constant threshold to a value (in valid bits) that is no smaller than the largest possible code size, the thread 410(t) can conservatively determine the refill flag 430(t) without tracking the occupancy of the input buffer 420(t) based on the codes included in the input buffer 420(t).

Subsequently, the threads 410(1)-410(T-1) concurrently determine the input offsets 440(1)-410(T-1) based on the refill flags 430. For an integer x from 1 to (T-1), the thread 410(x) sets the input offset 440(x) based on the sum of the refill flags 430(0)-430(x-1). In some embodiments, the input offsets 440 are specified in words and the thread 410(x) sets the input offset 440(x) to the sum of the refill flags 430(0)-430(x-1). Accordingly, the value of the input offset 440(x) can range from 0 to x, where 0 indicates that none of the input buffers 420(0)-420(x-1) require a refill, and x indicates the all of the input buffers 420(0)-420(x-1) require refills. The sum of the refill flags 430(0)-430(x-1) is also referred to herein as the $(x-1)^{th}$ element of the prefix sum of the refill flags 430. In some other embodiments, the input offsets 440 are not specified in words and the thread 410(x) converts the sum of the refill flags 430(0)-430(x-1) to the units of size associated with the input offsets 440 to determine the input offset 440(x).

Subsequently, the threads 410 for which the refill flag 430 is one execute read steps 450 in lock-step. The threads 410 for which the refill flag 430 is zero skip the read steps 450. To execute the read step 450(x), the thread 410(x) reads a word from the encoded sequence 402 based on the sum of the shared input pointer 404 and the input offset 440(x) and then appends the word to the input buffer 420(x). Accordingly, the threads 410 collectively read as few as zero and as many as T contiguous words from the encoded sequence 402. Advantageously, the memory accesses of the encoded sequence 402 during decoding are therefore dense and aligned.

The threads 410(0)-410(T-1) then execute decode steps 460(0)-460(T-1), respectively. In some embodiments, during the decode step 460(t), the thread 410(t) reads and removes a single code from the input buffer 420(t) in a first in, first out fashion. As described previously herein in conjunction with FIG. 1, because each word can begin and/or end with a partial word, the single code can include bits from multiple words. The thread 410(t) decodes the code to determine a literal symbol representing a single literal that the thread 410(t) stores as the decode 462(t) or a copy symbol representing a string of literals that the thread 410(t) stores as the decode 462(t). The thread 410(t) then sets the decode size 464(t) equal to the size of the decode 462(t).

The thread 410(t) can decode the code in any technically feasible fashion. For instance, in some embodiments, the thread 410(t) executes any number and/or types of decoding algorithms that reverse the mapping of symbols to codes used to generate the encoded sequence 402. In some embodiments, the code can be a copy code. Advantageously, because the decoding thread group 390 incrementally generates the decoded sequence 498 from beginning to end without gaps, each original string of literals back-referenced via the copy code is already stored in the decoded sequence 498 or is available from one of the threads 410 having a lower thread ID. The decoding thread group 390 therefore does not defer the processing of copy codes.

As shown, the threads 410(1)-410(T-1) concurrently determine the output offsets 470(1)-470(T-1), respectively, based on the decode sizes 464. For an integer x from 1 to (T-1), the thread 410(x) sets the output offset 470(x) equal to the sum of the decode sizes 464(0)-464(x-1). Subsequently, the threads 410(0)-410(T-1) execute write steps 480(0)-480(T-1), respectively, in lock-step. To execute the write step 480(x), the thread 410(x) copies the decode 462(x) to the decoded sequence 498 starting at the location specified by the sum of the shared output pointer 406 and the output offset 470(x). In this fashion, the threads 410 collectively writes a contiguous group of literals corresponding to a contiguous group of symbols to the decoded sequence 498. Advantageously, the memory accesses of the decoded sequence 498 during decoding are therefore dense. In some embodiments, each of the symbols is a byte and the memory accesses of the encoded sequence 402 during decoding are also aligned.

The lead thread then executes a lead thread step 490 to advance both the shared input pointer 404 and the shared output pointer 406. As shown, in some embodiments, the thread 410(0) is the lead thread. In some embodiments, the shared input pointer 404 is specified in words and the lead thread increments the shared input pointer 404 by the sum of the refill flags 430(0)-430(T-1). In some other embodiments, the shared input pointer 404 is not specified in words and the lead thread converts the sum of the refill flags 430(0)-430(T-1) to the units of size associated with the shared input pointer 404 to increment the shared input pointer 404. The lead thread increments the shared output pointer 406 by the sum of the decode sizes 464(0)-464(T-1).

The decoding thread group 390 continues to execute decoding iterations until the decoding thread group 390 has finished generating the decoded sequence 498. In some embodiments, the number of codes included in the encoded sequence 402 is not a multiple of the thread group size 182 and the decoding thread group 390 inactivates each of the threads 410 when the thread 410 has decoded all of the codes assigned to the thread 410.

Note that the techniques described herein are illustrative rather than restrictive and may be altered without departing from the broader spirit and scope of the invention. Many modifications and variations on the functionality provided by the decoding thread group 390 will be apparent to those of ordinary skill in the art without departing from the scope and spirit of the described embodiments.

Figure 5:
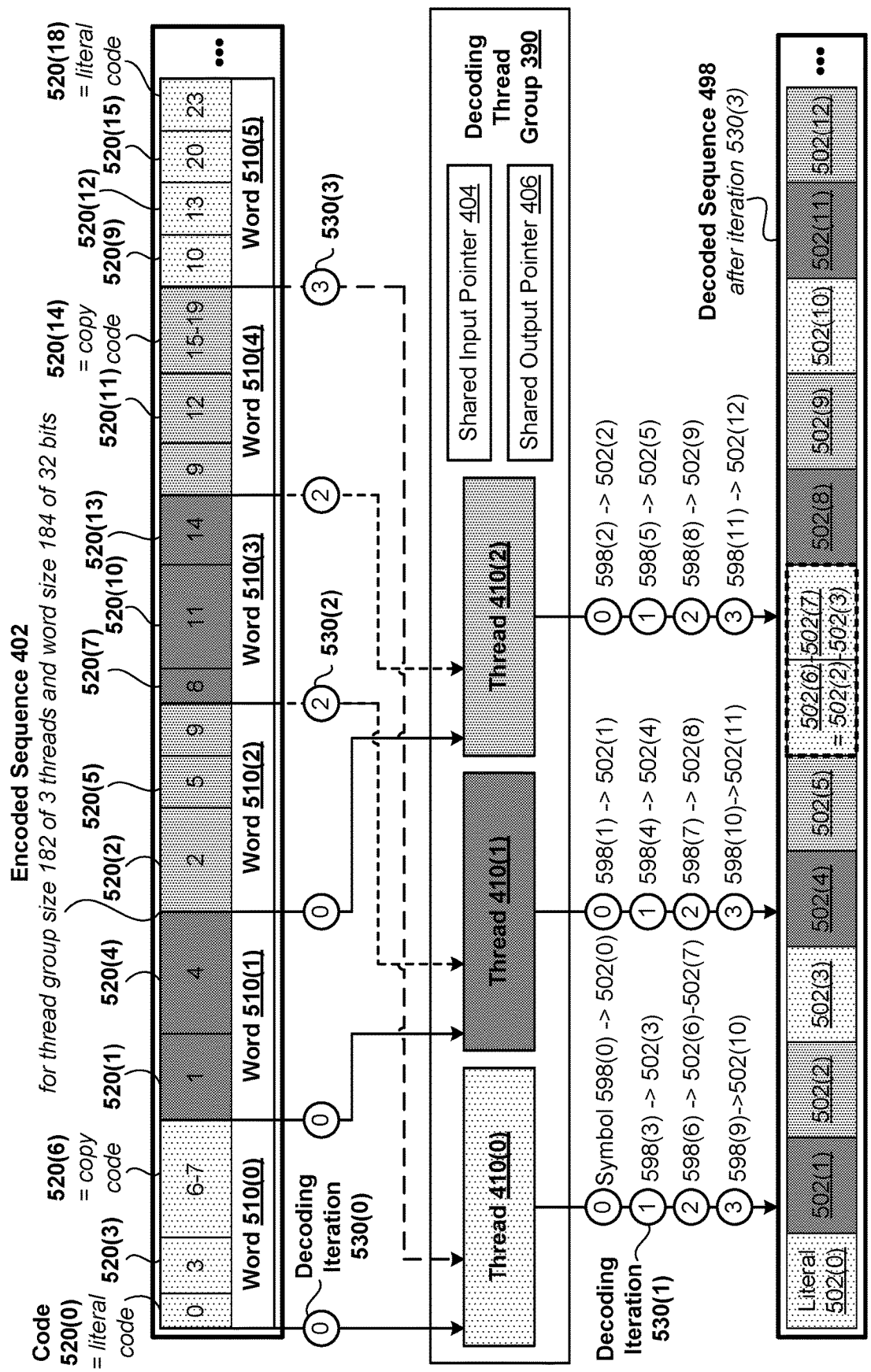
FIG. 5 is a conceptual illustration of how the decoding thread group of FIG. 4 generates the decoded sequence, according to various embodiments.

FIG. 5 is a conceptual illustration of how the decoding thread group 390 of FIG. 4 generates the decoded sequence 498, according to various embodiments. For explanatory purposes only, FIG. 5 depicts a beginning portion of an exemplary instance of the encoded sequence 402 that is associated with the thread group size 182 of three threads and the word size 184 of thirty-two bits. FIG. 5 also depicts a portion of the decoded sequence 498 at a point in time after the decoding thread group 390 executes decoding iterations 530(0)-530(3).

As shown, the encoded sequence 402 includes, without limitation, words 510(0)-510(5) and any number of other words 510 (depicted with ellipses). Each of the words 510 includes, without limitation, any integer or non-integer number of codes 520. Although not shown, the source sequence is represented by symbols 598(0)-598(18), and any number of other symbols 598 ((depicted with ellipses). In the embodiment depicted in FIG. 5, and as described previously herein in conjunction with FIG. 1, the entropy encoding application 180 encodes the symbols 598(0)-598(18) to generate codes 520(0)-520(18), respectively. In the embodiment depicted in FIG. 5, for an integer x from 0 to 18, the entropy encoding application 180 assigns the code 520(x) to the thread 410(x % 3) for decoding during a decoding iteration 530(floor(x/3)). And, for each thread 410, the entropy encoding application 180 packs the bits for the codes 520 that are assigned to the thread 410 into words 510 of thirty-two bits to generate the encoded sequence 402.

Consequently, as shown, the word 510(0) includes, without limitation, the codes 520(0), 520(3), and 520(6). The word 510(1) includes, without limitation, the codes 520(1) and 520(4). The word 510(2) includes, without limitation, the codes 520(2) and 520(5) as well as an initial portion of the code 520(8). The word 510(3) includes, without limitation, the codes 520(7), 520(10), and 520(13). The word 510(4) includes, without limitation, the remaining portion of the code 520(8) and the codes 520(11) and 520(14). The word 510(5) includes, without limitation, the codes 520(9), 520(12), 520(15), and 520(18).

Each of the codes 520 is a literal code or a copy code. Each of the literal codes is annotated with a single integer that specifies the index of a literal 502 within the source sequence that is represented by a symbol 598 corresponding to the literal code. Each of the copy codes is annotated with an integer range that specifies the indices of a string of literals 502 within the source sequence that is represented by the symbol 598 corresponding to the copy code. For explanatory purposes only, numbering with respect to the source sequence is zero-based. Accordingly, the literal 502(0) corresponds to the initial one of the literals 502 included in the source sequence, the literal 502(1) corresponds to next of the literals 502 included in the source sequence, and so forth.

For instance, the code 520(0) is a literal code that is annotated with 0 to indicate that the code 520(0) corresponds to the literal 502(0) represented by the symbol 598(0). The code 520(6) is a copy code that is annotated with 6-7 to indicate that the code 520(6) corresponds to a copy to a string of literals 502(6)-502(7), where the copy is represented by the symbol 598(6). And the code 520(18) is a literal code that is annotated with 23 to indicate that the code 520(18) corresponds to the literal 502(23) represented by the symbol 598(18).

For explanatory purposes only, the thread 410(0) and the words 510(0) and 510(5) that are decoded by the thread 410(0) are depicted via lightly shaded boxes, the thread 410(1) and the words 510(1) and 510(3) that are decoded by the thread 410(1) are depicted via darkly shaded boxes, and the thread 410(2) and the words 510(2) and 510(4) that are decoded by the thread 410(2) are depicted via moderately shaded boxes. Furthermore, circles annotated with numbers specifying the decoding iterations 530 are superimposed on arrows to indicate the words 510 that the decoding thread group 390 reads from the encoded sequence 402, the symbols 598 that the decoding thread group 390 determines during decoding, and the literals 502 that the decoding thread group 390 writes to the decoded sequence 498 during each of the decoding iterations 530(0)-530(3).

As shown, during the decoding iteration 530(0), the threads 410(0)-410(2) read the words 510(0)-510(2), respectively, from the encoded sequence 402. The threads 410(0)-410(2) decode the codes 520(0)-520(2), respectively, to determine symbols 598(0)-598(2), respectively. The threads 410(0)-410(2) then write literals 502(0)-502(2), respectively, represented by the symbols 598(0)-598(2), respectively, to the decoded sequence 498.

During the decoding iteration 530(1), none of the threads 410(0)-410(2) read from the encoded sequence 402. The threads 410(0)-410(2) decode the codes 520(3)-520(5), respectively, to determine symbols 598(3)-598(5), respectively. The threads 410(0)-410(2) then write literals 502(3)-502(5), respectively, represented by the symbols 598(3)-598(5), respectively, to the decoded sequence 498.

During the decoding iteration 530(2), since the word 510(1) stores two of the codes 520, and the word 510(2) stores two and a half of the codes 520, the threads 410(1) and 410(2) read the words 510(3) and 510(4), respectively, from the encoded sequence 402. By contrast, because the word 510(0) stores three of the codes 520, the thread 410(0) does not read from the encoded sequence 402 during the decoding iteration 530(2).

The thread 410(0) decodes the code 520(6) that is a copy code to determine symbol 598(6) representing a copy. More specifically, and for explanatory purposes only, the symbol 598(6) represents a copy of a string of literals 502(2)-502(3). Accordingly, the thread 410(0) writes a string of literals 502(6)-502(7) that is a copy of the string of literals 502(2)-502(3) to the decoded sequence.

The threads 410(1) and 410(2) decode the codes 520(7) and 520(8), respectively, to determine symbols 598(7)-598(8), respectively. The threads 410(1) and 410(2) then write literals 502(8)-502(9), respectively, represented by the symbols 598(7)-598(8), respectively, to the decoded sequence 498.

During the decoding iteration 530(3), the thread 410(0) reads the word 510(5) from the encoded sequence 402, but neither the thread 410(1) nor the thread 410(2) read from the encoded sequence 402. The threads 410(0)-410(2) decode the codes 520(9)-520(11), respectively, to generate symbols 598(9)-598(11), respectively. The threads 410(0)-410(2) then write literals 502(10)-502(12), respectively, represented by the symbols 598(9)-598(11), respectively, to the decoded sequence 498.

Advantageously, as FIG. 5 illustrates graphically, the memory accesses to both the encoded sequence 402 and the decoded sequence 498 are dense and aligned. Furthermore, because the decoding thread group 390 incrementally generates the decoded sequence 498 from beginning to end, the decoding thread group 390 does not need to defer the processing of copy codes.

Figure 6:
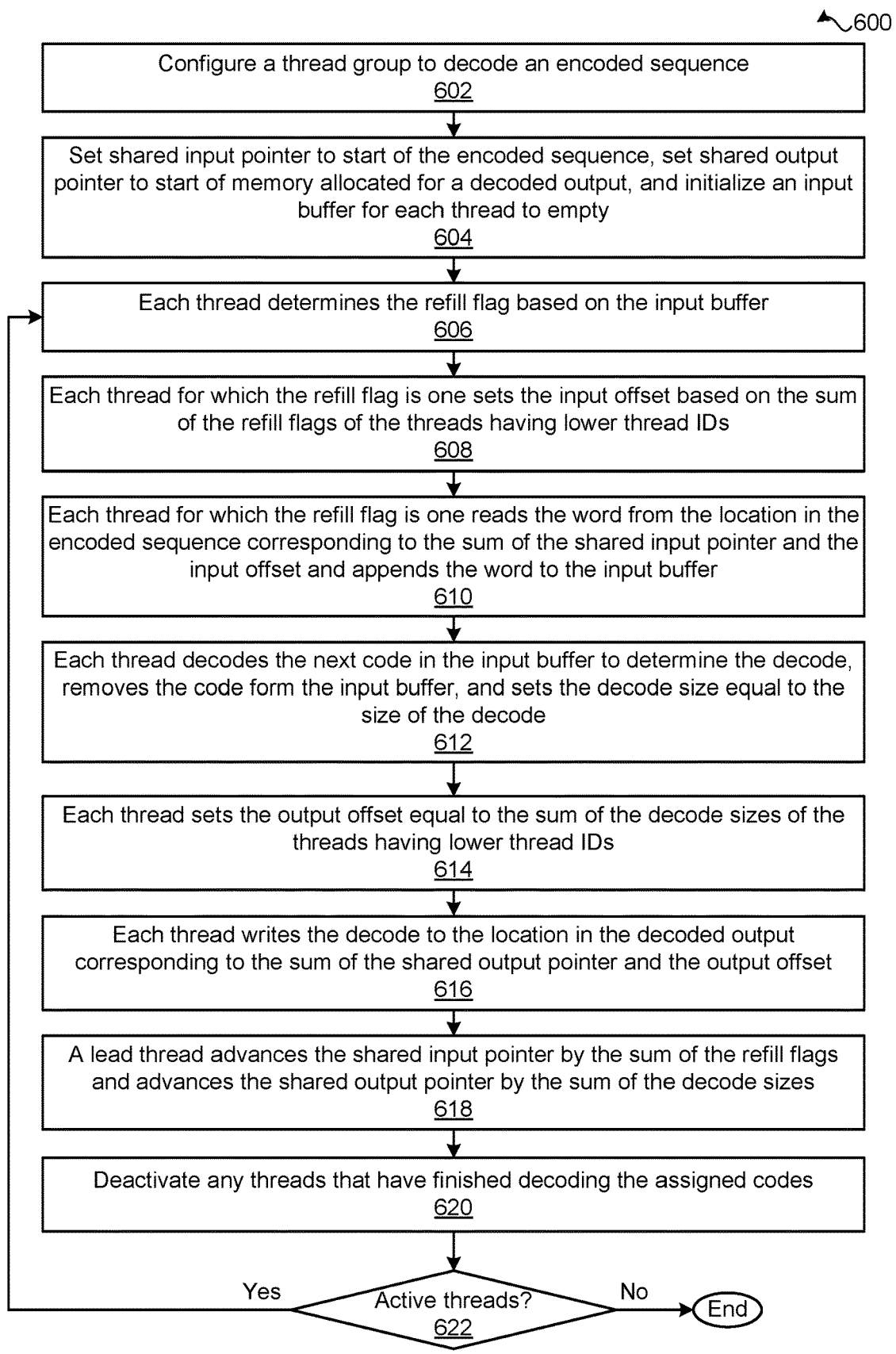
FIG. 6 is a flow diagram of method steps for decoding encoded sequences that include variable-length codes, according to various embodiments.

FIG. 6 is a flow diagram of method steps for encoded sequences that include variable-length codes, according to various embodiments. Although the method steps are described with reference to the systems of FIGS. 1-5, persons skilled in the art will understand that any system configured to implement the method steps, in any order, falls within the scope of the present invention.

As shown, a method 600 begins at step 602, where, the parallel decoding application 190 configures the decoding thread group 390 to decode the encoded sequence 402. At step 604, the decoding thread group 390 sets the shared input pointer 404 to point to the start of the encoded sequence 402, sets the shared output pointer 406 to point to the start of the memory allocated for the decoded output, and each of the threads 410 initialize the input buffer 420 of the thread 410 to empty. At step 606, each of the threads 410 determine the refill flag 430 of the thread 410 based on the input buffer 420 of the thread 410.

At step 608, each of the threads 410 for which the refill flag 430 is one sets the input offset 440 of the thread 410 equal to the sum of the refill flags 430 of the threads 410 having lower thread IDs. At step 610, each of the threads 410 for which the refill flag 430 is one reads the word 510 from the location in the encoded sequence 402 corresponding to the sum of the shared input pointer 404 and the input offset 440 of the thread 410 and appends the word 510 to the input buffer 420 of the thread 410.

At step 612, each of threads 410 decodes the next one of the codes 520 in the input buffer 420 of the thread 410 to determine the decode 462 of the thread 410, removes the code 520 from the input buffer 420, and sets the decode size 464 of the thread 410 equal to the size of the decode 462 of the thread 410. At step 614, each of the threads 410 sets the output offset 470 of the thread 410 equal to the sum of the decode sizes 464 of the threads 410 having lower thread IDs. At step 616, each of the threads 410 writes the decode 462 of the thread 410 to the location in the decoded sequence 498 corresponding to the sum of the shared output pointer 406 and the output offset 470 of the thread 410.

At step 618, the lead thread (e.g., the thread 410(0)) advances the shared input pointer 404 by the sum of the refill flags 430 and advances the shared output pointer 406 by the sum of the decode sizes 464. At step 620, the decoding thread group 390 deactivates any of the threads 410 that have finished decoding the codes 520 assigned to the thread 410. At step 622, the decoding thread group 390 determines whether any of the threads 410 are active. If, at step 622, the decoding thread group 390 determines that none of the threads 410 are active, then the method 600 terminates.

If, however, at step 622, the decoding thread group 390 determines that at least one of the threads 410 is active, then the method 600 returns to the step 606, where the threads 410 determine the refill flags 430 of the threads. The decoding thread group 390 continues to cycle through steps 606-622 until, at step 622, the decoding thread group 390 determines that none of the threads 410 are active. The method 600 then terminates.

In sum, the disclosed techniques can be used to efficiently decode an encoded sequence via a thread group of software or hardware threads to generate a decoded sequence in increments of contiguous groups of symbols from beginning to end without gaps. In some embodiments, an entropy encoding application generates the encoded sequence based on a thread group size denoted as T and a word size denoted as B. The entropy encoding application maps symbols representing literals included in the source sequence to a sequence of codes. The entropy encoding application repeatedly assigns contiguous groups of T codes to T thread IDs from 0 to T-1. Accordingly, the entropy encoding application assigns the $x^{th}$ code with respect to the source sequence to the thread corresponding to the thread ID of x % T for decoding during the floor(x/T) decoding iteration. For each thread ID, the entropy encoding application packs the bits for the assigned codes into words that each have B bits. To generate the encoded sequence, the entropy encoding application arranges the words based on a primary criterion of increasing decoding iteration and a secondary criterion of increasing thread ID.

In some embodiments, a parallel decoding application decodes the encoded sequence to generate a decoded output. The parallel decoding application configures a group of T threads to each execute a different instance of a decoder kernel, thereby generating a decoding thread group. A lead thread included in the decoding thread group sets a shared input pointer to point to the start of the encoded sequence and a shared output pointer to point to the beginning of memory allocated for the decoded output. Each thread initializes an input buffer of the thread to indicate that the input buffer is empty. The threads then execute decoding iterations until the decoding thread group finishes decoding the encoded sequence.

During each decoding iteration, each thread sets a refill flag of the thread to zero if at least one complete code remains in the input buffer of the thread and sets the refill flag of the thread to one otherwise. Each thread having a refill flag of one sets the input offset of the thread equal to the sum of the refill flags of the threads having lower thread IDs. Each thread having a refill flag of one reads the word at the location within the encoded sequence that corresponds to the sum of the shared input pointer and the input offset of the thread and appends the word to the input buffer of the thread. Importantly, threads having refill flags of zero do not read from the encoded sequence during the decoding iteration.

Each thread extracts the first remaining code from the input buffer of the thread and decodes the code to determine the decode of the thread. The threads can decode the codes using any number and/or types of decoding algorithms. Each thread sets the decode size of the thread equal to the size of the decode. Each thread sets the output offset of the thread equal to the sum of the decode sizes of the threads having lower thread IDs. Subsequently, each thread writes the decode of the thread to the decoded output starting at the location corresponding to the sum of the shared output pointer and the output offset of the thread. To finish the decoding iteration, the lead increments the shared input pointer by the sum of the refill flags and increments the shared output pointer by the sum of the decode sizes.

At least one technical advantage of the disclosed techniques relative to the prior art is that, with the disclosed techniques, decoding thread groups do not require metadata to efficiently decode encoded sequences that include variable-length codes in parallel. More specifically, the format the entropy encoding application institutes by systematically rearranging the codes relative to the corresponding symbols enables the threads in the decoding thread group to deterministically access groups of codes for parallel decoding without any additional information. And, unlike prior art techniques, because the threads read any number (including zero) of contiguous words from the encoded sequence and append a group of contiguous literals to the decoded sequence during each decoding iteration, the decoding throughput is not reduced by sparse memory accesses. Furthermore, because the decoding thread group incrementally generates the decoded output from beginning to end without gaps, literals referenced by each copy symbol are available when the decoding thread group decodes the corresponding copy code. Consequently, relative to prior-art techniques that store copy codes for deferred processing, the decoding thread group can more efficiently decode copy codes. These technical advantages provide one or more technological improvements over prior art approaches.

Any and all combinations of any of the claim elements recited in any of the claims and/or any elements described in this application, in any fashion, fall within the contemplated scope of the embodiments and protection.

The descriptions of the various embodiments have been presented for purposes of illustration but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module," a "system," or a "computer." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program codec embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory, a read-only memory, an erasable programmable read-only memory, Flash memory, an optical fiber, a portable compact disc read-only memory, an optical storage device, a magnetic storage device, or any suitable combination of the foregoing. In the context of this document, a computer readable storage medium may be any tangible medium that can contain or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A method for decoding an encoded sequence that includes variable-length codes, the method comprising:
    determining a first plurality of codes based on the encoded sequence;
    decoding the first plurality of codes to generate a first plurality of symbols;
    determining a first plurality of offsets based on the first plurality of symbols; and
    generating a first contiguous portion of a decoded sequence based on the first plurality of symbols, the first plurality of offsets, and a first address.

2. The method of claim 1, wherein generating the first contiguous portion of the decoded sequence comprises, for each offset included in the first plurality of offsets, writing a different literal represented by a different symbol included in the first plurality of symbols to a different location in the decoded sequence, wherein the different location is specified by the sum of the offset and the first address.

3. The method of claim 1, wherein determining the first plurality of codes comprises:
    determining a plurality of refill flags based on a first plurality of input buffers;
    reading one or more contiguous fixed-lengths words from the encoded sequence based on the plurality of refill flags and a second address to generate a second plurality of input buffers; and
    extracting a different code from each input buffer included in the second plurality of input buffers to generate the first plurality of codes.

4. The method of claim 1, wherein decoding the first plurality of codes comprises:
    determining that a first code included in the first plurality of codes comprises a copy code; and
    computing at least two literals based on the first code and at least one of the decoded sequence or at least a second code included in the first plurality of codes.

5. The method of claim 1, wherein decoding the first plurality of codes comprises executing one or more decoding algorithms on the first plurality of codes.

6. The method of claim 1, wherein determining the first plurality of offsets comprises computing a first plurality of sizes based on the first plurality of symbols and computing a prefix sum of the first plurality of sizes.

7. The method of claim 1, further comprising:
    adding the sum of the first plurality of offsets to the first address to generate a second address; and
    generating a second contiguous portion of the decoded sequence based on the encoded sequence and the second address.

8. The method of claim 1, wherein determining the first plurality of codes comprises:
    determining a plurality of refill flags based on a first plurality of input buffers;
    computing a second plurality of offsets based on a prefix sum of the plurality of refill flags;
    reading one or more contiguous fixed-lengths words from the encoded sequence based on the second plurality of offsets and a second address to generate a second plurality of input buffers; and
    extracting a different code from each input buffer included in the second plurality of input buffers to generate the first plurality of codes.

9. The method of claim 8, further comprising:
    adding the sum of the second plurality of offsets to the second address to generate a third address;
    determining a second plurality of codes based on the encoded sequence, the third address, and the second plurality of input buffers; and
    generating a second contiguous portion of the decoded sequence based on the second plurality of codes.

10. The method of claim 1, wherein a group of threads executing in a multithreaded processor generate the first contiguous portion of the decoded sequence, and wherein the size of the group of threads matches a thread group size associated with the encoded sequence.

11. One or more non-transitory computer readable media including instructions that, when executed by one or more processors, cause the one or more processors to decode an encoded sequence that includes variable-length codes by performing the steps of:
    determining a first plurality of codes based on the encoded sequence;
    decoding the first plurality of codes to generate a first plurality of symbols;
    determining a first plurality of offsets based on the first plurality of symbols; and
    generating a first contiguous portion of a decoded sequence based on the first plurality of symbols, the first plurality of offsets, and a first address.

12. The one or more non-transitory computer readable media of claim 11, wherein determining the first plurality of codes comprises:
    determining that a first input buffer included in a plurality of input buffers includes less than one code;

in response, performing one or more read operations on the encoded sequence to determine a first fixed-length word;
adding the first fixed-length word to the first input buffer; and
extracting a different code from each input buffer included in the plurality of input buffers to generate the first plurality of codes.

13. The one or more non-transitory computer readable media of claim 11, wherein decoding the first plurality of codes comprises:
determining that a first code included in the first plurality of codes comprises a copy code; and
reading at least two literals from the decoded sequence based on the copy code.

14. The one or more non-transitory computer readable media of claim 11, wherein decoding the first plurality of codes comprises executing one or more decoding algorithms on the first plurality of codes.

15. The one or more non-transitory computer readable media of claim 11, wherein determining the first plurality of offsets comprises computing a first plurality of sizes based on the first plurality of symbols and computing a prefix sum of the first plurality of sizes.

16. The one or more non-transitory computer readable media of claim 11, further comprising:
adding the sum of the first plurality of offsets to the first address to generate a second address; and
generating a second contiguous portion of the decoded sequence based on the encoded sequence and the second address.

17. The one or more non-transitory computer readable media of claim 11, wherein determining the first plurality of codes comprises:
determining a plurality of refill flags based on a first plurality of input buffers;
computing a second plurality of offsets based on a prefix sum of the plurality of refill flags;
reading one or more contiguous fixed-lengths words from the encoded sequence based on the second plurality of offsets and a second address to generate a second plurality of input buffers; and
extracting a different code from each input buffer included in the second plurality of input buffers to generate the first plurality of codes.

18. The one or more non-transitory computer readable media of claim 17, further comprising:
adding the sum of the second plurality of offsets to the second address to generate a third address;
determining a second plurality of codes based on the encoded sequence, the third address, and the second plurality of input buffers; and
generating a second contiguous portion of the decoded sequence based on the second plurality of codes.

19. The one or more non-transitory computer readable media of claim 11, wherein a group of independent hardware processes associated with at least one fixed-function hardware units determine the first plurality of codes based on the encoded sequence, and wherein the size of the group of independent hardware processes matches a thread group size associated with the encoded sequence.

20. A system comprising:
one or more memories storing instructions; and
one or more processors coupled to the one or more memories that, when executing the instructions, perform the steps of:
determining a first plurality of codes based on an encoded sequence;
decoding the first plurality of codes to generate a first plurality of symbols;
determining a first plurality of offsets based on the first plurality of symbols; and
generating a first contiguous portion of a decoded sequence based on the first plurality of symbols, the first plurality of offsets, and a first address.

* * * * *